(12) United States Patent
Wang et al.

(10) Patent No.: US 11,147,168 B2
(45) Date of Patent: Oct. 12, 2021

(54) MIDDLE FRAME FOR SUPPORTING FLEXIBLE DISPLAY AND A FLEXIBLE DISPLAY DEVICE

(71) Applicant: Wuhan China Star Optoelectronics Semiconductor Display Technology Co., Ltd., Hubei (CN)

(72) Inventors: Szu Yuan Wang, Hubei (CN); Lei Hu, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 151 days.

(21) Appl. No.: 15/749,447

(22) PCT Filed: Sep. 1, 2017

(86) PCT No.: PCT/CN2017/100202
§ 371 (c)(1),
(2) Date: Oct. 27, 2019

(87) PCT Pub. No.: WO2019/028954
PCT Pub. Date: Feb. 14, 2019

(65) Prior Publication Data
US 2020/0245476 A1    Jul. 30, 2020

(30) Foreign Application Priority Data
Aug. 11, 2017   (CN) .......................... 201710684493.9

(51) Int. Cl.
*H05K 5/00* (2006.01)
*H05K 1/02* (2006.01)
*H05K 7/14* (2006.01)

(52) U.S. Cl.
CPC ......... *H05K 5/0017* (2013.01); *H05K 1/0277* (2013.01); *H05K 7/1418* (2013.01)

(58) Field of Classification Search
CPC ..................................................... G02F 1/1333
See application file for complete search history.

(56) References Cited

U.S. PATENT DOCUMENTS 4,238,848 A * 12/1980 Yamaguchi .............. G04G 9/06
368/276
6,031,524 A * 2/2000 Kunert ................. G06F 3/0202
345/169
(Continued)

FOREIGN PATENT DOCUMENTS

CN          1800946 A    7/2006
CN        201107493 Y    8/2008
(Continued)

*Primary Examiner* — Krystal Robinson
(74) *Attorney, Agent, or Firm* — Hemisphere Law, PLLC; Zhigang Ma

(57) ABSTRACT

A middle frame for supporting flexible display is provided. The middle frame for supporting flexible display comprises middle frame element, and a first through groove and a second through groove respectively located on lateral sides of middle frame element. The invention further provided a flexible display device includes middle frame and flexible display positioned in the middle frame element. The flexible display includes flexible substrate, printing wiring board, and at least one of two lateral sides on flexible substrate adjacent printing wiring board has a protrusion portion. A first through groove is correspondingly located to the printing wiring board, and second through groove is correspondingly located to the protrusion portion. The protrusion portion fixed in second through groove, partial wiring board of printing wiring board fixed in first through groove. This present invention solved the problem about difficult aligning flexible display and middle frame.

8 Claims, 3 Drawing Sheets

(56) References Cited

U.S. PATENT DOCUMENTS

| | | | | |
|---|---|---|---|---|
| 6,317,313 B1* | 11/2001 | Mosgrove | ........... | G07C 9/00944 |
| | | | | 361/679.3 |
| 6,909,475 B2* | 6/2005 | Kojima | ................. | G06F 1/1626 |
| | | | | 349/58 |
| 7,130,185 B2* | 10/2006 | Chen | ................... | G02F 1/13452 |
| | | | | 361/679.3 |
| 7,697,275 B2* | 4/2010 | Chen | ....................... | G03B 21/56 |
| | | | | 361/679.3 |
| 8,437,148 B2* | 5/2013 | Hsu | ........................ | H05K 13/04 |
| | | | | 361/829 |
| 8,584,847 B2* | 11/2013 | Tages | ................... | H04B 1/3888 |
| | | | | 206/320 |
| 8,955,678 B2* | 2/2015 | Murphy | ................. | G06F 1/1626 |
| | | | | 206/320 |
| 9,606,287 B2* | 3/2017 | Lee | ....................... | G02B 6/0088 |
| 2001/0002145 A1* | 5/2001 | Lee | .................. | G02F 1/133308 |
| | | | | 349/58 |
| 2008/0136995 A1* | 6/2008 | Oohira | .............. | G02F 1/133308 |
| | | | | 349/58 |
| 2009/0009682 A1* | 1/2009 | Chung | ................ | G02F 1/13452 |
| | | | | 349/58 |
| 2009/0256991 A1* | 10/2009 | Shinn | ................. | G02F 1/133305 |
| | | | | 349/60 |
| 2012/0062485 A1 | 3/2012 | Kim | | |
| 2012/0182492 A1* | 7/2012 | Ro | .................... | B29C 45/14336 |
| | | | | 349/58 |
| 2013/0044462 A1* | 2/2013 | Cheng | .................... | G02B 6/005 |
| | | | | 362/97.1 |
| 2013/0077347 A1* | 3/2013 | Hsu | ....................... | G02B 6/0068 |
| | | | | 362/613 |
| 2013/0162581 A1* | 6/2013 | Ujii | ........................ | G06F 3/016 |
| | | | | 345/173 |
| 2014/0232686 A1* | 8/2014 | Kotera | ................... | G06F 3/0412 |
| | | | | 345/174 |

FOREIGN PATENT DOCUMENTS

| | | |
|---|---|---|
| CN | 202435448 U | 9/2012 |
| CN | 204347379 U | 5/2015 |
| CN | 105866996 A | 8/2016 |
| CN | 205594259 U | 9/2016 |
| CN | 106205384 A | 12/2016 |
| CN | 206249167 U | 6/2017 |

* cited by examiner

MIDDLE FRAME FOR SUPPORTING FLEXIBLE DISPLAY AND A FLEXIBLE DISPLAY DEVICE

RELATED APPLICATIONS

The present application is a National Phase of International Application Number PCT/CN2017/100202, filed Sep. 1, 2017, and claims the priority of China Application No. 201710684493.9, filed Aug. 11, 2017.

FIELD OF THE DISCLOSURE

The disclosure relates to a display technical field, and more particularly to a middle frame for supporting flexible display and a flexible display device.

BACKGROUND

With the continuous development of OLED (Organic Light-Emitting Diode), consumers feel the huge difference between the OLED display and the traditional LCD (Liquid Crystal Display) display, and then rapid growth of the consumer market in the OLED. It could achieves features of short response time, high-contrast, wide viewing angle, wide color gamut, thin, flexible due to the self-emitting features of OLED. Particular to flexible feature of display could bring the new concept for consumers, so that flexible OLED is the mainstream development of OLED in recent year.

However, it increases difficulty of produce because of flexible substrate feature of the flexible OLED. Especially to the adherent process of the flexible module, the flexible feature usually brings some problem of decreases yield, effects productivity and enhances cost.

In order to fix and protect display module well, terminal manufacturers generally will fixes the display module in the middle frame for ensure stability of display module. Compares with the traditional LCD module is not easily deformed by using glass substrate so that it is easily to fixed, the flexible display module has characteristic of soft, curved or even bending by using flexible substrate so that it will cause some problem, for example it is not easily adjusted during fixing process, aligning mistake, difficulty repeat process.

SUMMARY

A technical problem to be solved by the disclosure is to provide a middle frame for supporting flexible display and a flexible display device with solved the alignment problem while fixing the flexible display and the middle frame, and reduced repeat processing difficulties.

Furthermore, the disclosure further provides a middle frame for supporting flexible display including a middle frame element, and a first through groove and a second through groove respectively located on lateral sides of the middle frame element.

In an embodiment, the first through groove and the second groove are respectively located on different lateral sides of the middle frame element.

According to another aspect of the disclosure, the disclosure further provides a flexible display device. The flexible display device includes a middle frame and a flexible display. The middle frame includes a middle frame element. The flexible display includes a flexible substrate, a printing wiring board at positioned on lateral side of the flexible substrate. At least one of two lateral sides on the flexible substrate adjacent the printing wiring board has a protrusion portion. A first through groove and a second through groove are respectively located on lateral sides of the middle frame corresponding to the flexible display which are corresponding to the printing wiring board and the protrusion portion. The protrusion portion fixed in the second through groove, and partial wiring board of the printing wiring board fixed in the first through groove.

In an embodiment, wherein the protrusion portion has an extending part extending from the second through groove to outside of the middle frame element.

In an embodiment, first spacers are positioned between the first through groove and two lateral sides of the printing wiring board, and second spacers are positioned between the second through groove and two lateral sides of the protrusion portion.

In an embodiment, both of two lateral sides of the flexible substrate adjacent the printing wiring board have protrusion portions.

In an embodiment, two of the protrusion portions, one of the protrusion portion is located on a lateral side of the flexible substrate which adjacent and nearby the printing wiring board, and another of the protrusion portion is located on a lateral side of the flexible substrate which adjacent and far away the printing wiring board.

In an embodiment, both of the protrusion portions have different lengths.

In an embodiment, the protrusion portions are fixed in the second through groove by glue or magnetic absorption, and the partial wiring board of the printing wiring board located in the first through groove is fixed in the first through groove by glue or magnetic absorption.

In an embodiment, the protrusion portions are fixed in the second through groove by glue or magnetic absorption, and the partial wiring board of the printing wiring board located in the first through groove is fixed in the first through groove by glue or magnetic absorption.

Compare with the existing technology, this present invention solved the problem about difficult aligning flexible display and middle frame by positioned a protrusion portion on the flexible substrate and correspondingly positioned through groove on middle frame. And also solved the problem about the flexible display panel needs to repeat processing for offset by clamping protrusion portion to fixing flexible display again, so that solved the problem of difficult repeat process.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

The specific structural and functional details disclosed herein are only representative and are intended for describing exemplary embodiments of the disclosure. However, the disclosure can be embodied in many forms of substitution, and should not be interpreted as merely limited to the embodiments described herein.

The disclosure will be further described in detail with reference to accompanying drawings and preferred embodiments as follows.

Figure 5:
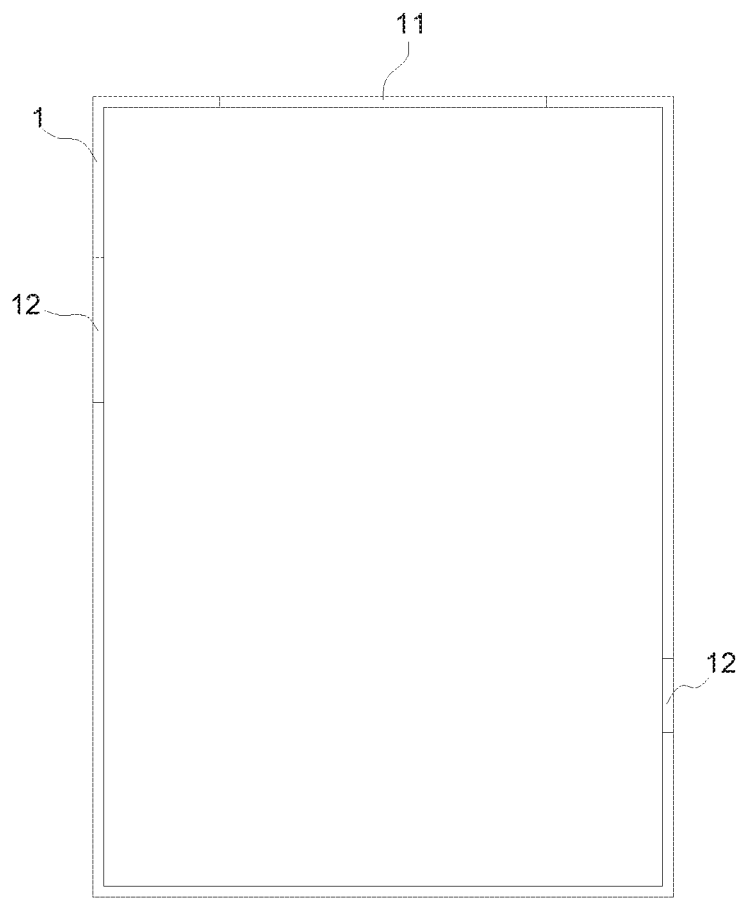
FIG. 5 is a structural schematic view of the middle frame according to an embodiment of the disclosure.

Please refer to FIG. 5, the middle frame for supporting flexible display of this present invention includes a middle frame element 1. The middle frame element 1 is a frame structure. A first through groove 11 and a second through groove 12 are respectively located on lateral sides of the middle frame element 1.

The first through groove 11 and the second groove 12 are respectively located on different lateral sides of the middle frame element 1.

Figure 1:
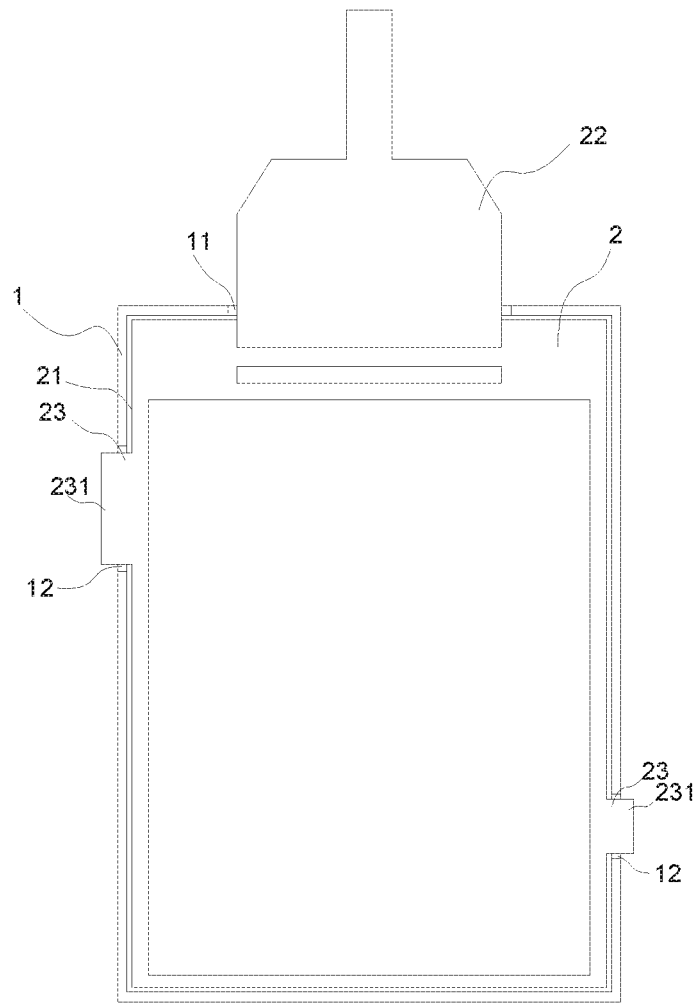
FIG. 1 is a schematic view of the flexible display connected with the middle frame according to an embodiment of the disclosure.
Figure 2:
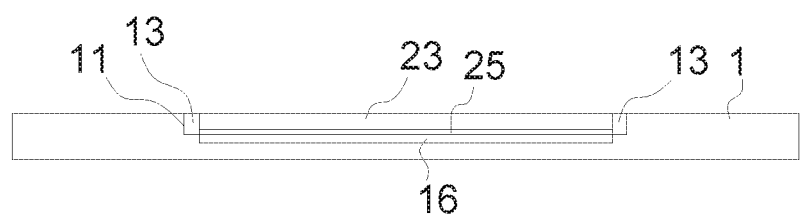
FIG. 2 is a assembled schematic view between the printing wiring board and the middle frame according to an embodiment of the disclosure.
Figure 3:
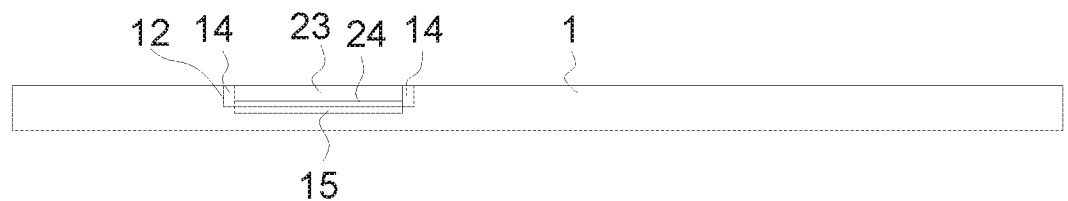
FIG. 3 is a assembled schematic view between the protrusion portion and the middle frame according to an embodiment of the disclosure.
Figure 6:
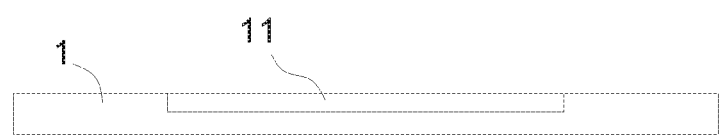
FIG. 6 is a schematic view of the first through groove of the middle frame according to an embodiment of the disclosure.
Figure 7:
FIG. 7 is a schematic view of the second through groove of the middle frame according to an embodiment of the disclosure.

Please refer to FIG. 1, FIG. 2 and FIG. 3. The flexible display device of this present invention includes a flexible display 2 and a middle frame element for supporting the flexible display 2. The flexible display 2 includes a flexible substrate 21, a printing wiring board 22 at positioned on lateral side of the flexible substrate 21. At least one of two lateral sides on the flexible substrate 21 adjacent the printing wiring board 22 has a protrusion portion 23. The middle frame includes a middle frame element 1. The flexible display 2 is disposed in the middle frame element 1. A first through groove 11 and a second through groove 12 are respectively located on lateral sides of the middle frame element 1 corresponding to the flexible display 2 which are corresponding to the printing wiring board 22 and the protrusion portion 23. The protrusion portions 23 are fixed in the second through groove 12, and partial wiring board of the printing wiring board 22 located in the first through groove 11 is fixed in the first through groove 11. Refer to FIG. 6 and FIG. 7. The first through groove 11 and the second through groove 12 both pass through inner surface and outer surface of the middle frame element 1.

The structure described above could provide easily recognition direction by the position of protrusion portion 23 and second through groove 12 during fixing the flexible display 2 and the middle frame element 1.

In order to easily adjust position of the flexible display 2, the protrusion portion 23 has an extending part 231 which is extended from the second through groove 12 to outside of the middle frame element 1. Therefore, it can be achieved that fine adjusting of flexible display 2 or peeling from middle frame element 1 by clamps the extending part 231.

Please refer to FIG. 2 and FIG. 3. In the present invention, the protrusion portions 23 are fixed in the second through groove 12 by glue or magnetic absorption. The partial wiring board of the printing wiring board 22 is fixed in the first through groove 11 by glue or magnetic absorption. When using the magnetic absorption for fixing, a metal layer 24 is positioned on a lateral surface of the protrusion portion 23 corresponding to the second through groove 12, and a first magnetic element 15 is positioned in the second through groove 12. A second metal 25 is positioned on a surface of the partial wiring board surface of the printing wiring board 22 corresponding to the first through groove 11, and a second magnetic element 16 is positioned in the first through groove 11. In order to achieve the magnetic absorption, it can alternatively change position of metal layer and magnetic element.

Please refer to FIG. 2 and FIG. 3. The first spacers 13 are positioned between the first through groove 11 and two lateral sides of the printing wiring board 22, and second spacers 14 are positioned between the second through groove 12 and two lateral sides of the protrusion portion 23. It is easily fine adjusting to the flexible display 2.

In the present invention, connection way of the printing wiring board 22 and scan line and data line formed on the non-display region of the flexible substrate 21 is using current technology. In addition, the flexible substrate 21 has TFT (Thin Film Transistor) array, anode, organic light emitting layer, cathode, packaged layer and driver chip positioned on the non-display region. Improvement of the present invention is focus on the flexible substrate; other elements will not be change so that it is not limited thereto.

Figure 4:
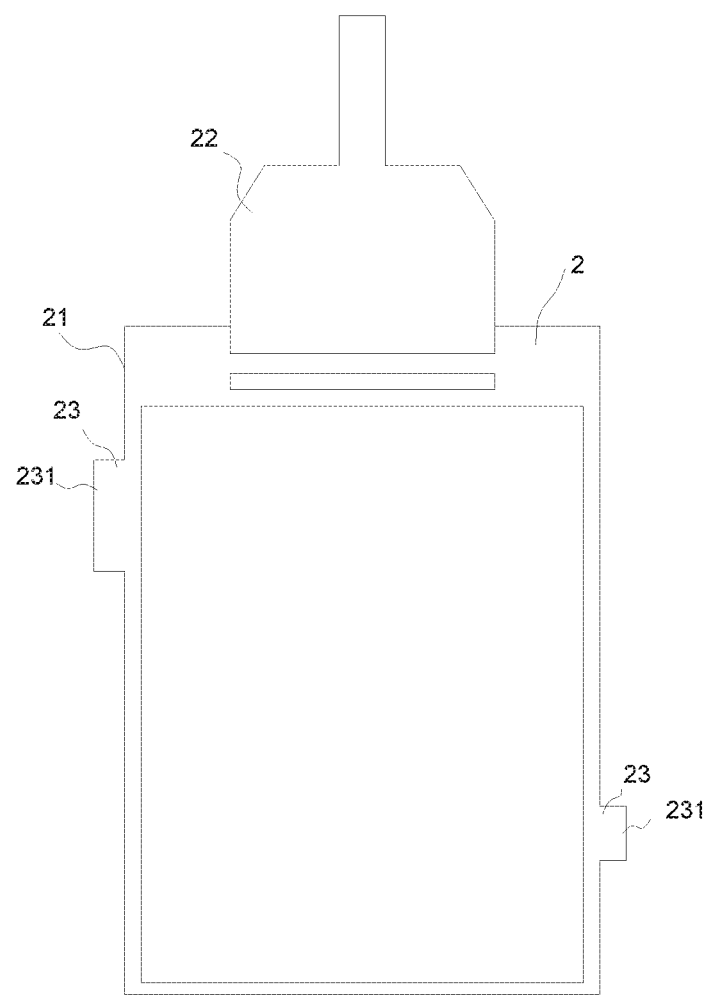
FIG. 4 is a structural schematic view of the flexible display according to an embodiment of the disclosure.

In an embodiment, please refer to FIG. 4. Both of two lateral sides of flexible substrate 21 which are adjacent the printing wiring board 22 have protrusion portions 23. Two of the protrusion portions 23 are positioned on two opposite lateral sides of the flexible substrate 21. Correspondingly, please refer to FIG. 5. There has two second through groove 12 are respectively located on the position corresponding to two protrusion portions 23, Specifically, one of the protrusion portion 23 is located on a lateral side of the flexible substrate 21 which adjacent and nearby the printing wiring board 22, and another of the protrusion portion 23 is located on a lateral side of the flexible substrate 21 which adjacent and far away the printing wiring board 22. It could enhances the reorganization and decreases package difficulty, also could be easily to fine adjust and pick up the flexible substrate 2 by positioning two protrusion portions 23, so that prevent the flexible display 2 damage.

In an embodiment, both of protrusion portions 23 have different lengths. The length of the protrusion portion 23 nearby the printing wiring board 22 is greater than the length of the protrusion portion 23 far away the printing wiring board 22. Correspondingly, lengths of two through grooves 12 also could relatively change by the protrusion portions 23.

In this embodiment, also shown as FIG. 2 and FIG. 3. In the present invention, the protrusion portions 23 are fixed in the second through groove 12 by glue or magnetic absorption. The partial wiring board of the printing wiring board 22 is fixed in the first through groove 11 by glue or magnetic absorption. When using the magnetic absorption for fixing, a metal layer 24 is positioned on a lateral surface of the protrusion portion 23 corresponding to the second through groove 12, and a first magnetic element 15 is positioned in the second through groove 12. A second metal 25 is positioned on a surface of the partial wiring board surface of the printing wiring board 22 corresponding to the first through groove 11, and a second magnetic element 16 is positioned in the first through groove 11. In order to achieve the magnetic absorption, it can alternatively change position of metal layer and magnetic element.

In the present invention, if the flexible display panel is offset or has other fixing problem, it needs to repeat process which could clamps protrusion portion 23 to fine adjustment or pick it up the flexible display for fixing again by tweezers or similar clamping device.

In the present invention, providing advantageous of easily fixing operation and easily repeat process of the flexible mould and the middle frame, according to changing shape of the flexible display panel and improve structure of the middle frame. It enhances productivity.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A flexible display device, comprising
   a middle frame, and
   a flexible display positioned in the middle frame,
   wherein the middle frame includes a middle frame element,
   wherein the flexible display includes a flexible substrate, a printing wiring board at positioned on lateral side of the flexible substrate,
   wherein at least one of two lateral sides on the flexible substrate adjacent the printing wiring board has a protrusion portion;
   wherein a first through groove and a second through groove are respectively located on lateral sides of the middle frame corresponding to the flexible display which are corresponding to the printing wiring board and the protrusion portion,
   wherein the protrusion portion fixed in the second through groove, and partial wiring board of the printing wiring board fixed in the first through groove; and
   wherein first spacers are positioned between the first through groove and two lateral sides of the printing wiring board, and second spacers are positioned between the second through groove and two lateral sides of the protrusion portion.

2. The flexible display device according to claim 1, wherein the protrusion portion has an extending part extending from the second through groove to outside of the middle frame element.

3. The flexible display device according to claim 2, wherein the protrusion portions are fixed in the second through groove by glue or magnetic absorption, and the partial wiring board of the printing wiring board located in the first through groove is fixed in the first through groove by glue or magnetic absorption.

4. The flexible display device according to claim 1, wherein both of two lateral sides of flexible substrate adjacent the printing wiring board have the protrusion portions.

5. The flexible display device according to claim 4, wherein two of the protrusion portions, one of the protrusion portion is located on a lateral side of the flexible substrate which adjacent and nearby the printing wiring board, and another of the protrusion portion is located on a lateral side of the flexible substrate which adjacent and far away the printing wiring board.

6. The flexible display device according to claim 5, wherein both of protrusion portions have different lengths.

7. The flexible display device according to claim 6, wherein the protrusion portions are fixed in the second through groove by glue or magnetic absorption, and partial wiring board of the printing wiring board located in the first through groove is fixed in the first through groove by glue or magnetic absorption.

8. The flexible display device according to claim 1, wherein the protrusion portions are fixed in the second through groove by glue or magnetic absorption, and the partial wiring board of the printing wiring board located in the first through groove is fixed in the first through groove by glue or magnetic absorption.

* * * * *